United States Patent [19]

Swarup

[11] Patent Number: 5,489,880
[45] Date of Patent: Feb. 6, 1996

[54] POWER DIVIDER/COMBINER WITH LUMPED ELEMENT BANDPASS FILTERS

[75] Inventor: Arvind Swarup, Cambridge, Canada

[73] Assignee: Com Dev Ltd., Cambridge, Canada

[21] Appl. No.: 238,504

[22] Filed: May 5, 1994

[30] Foreign Application Priority Data

Aug. 10, 1993 [CA] Canada .................................. 2103763

[51] Int. Cl.$^6$ .................................................. H01P 5/12
[52] U.S. Cl. .......................................... 333/128; 333/204
[58] Field of Search ..................................... 333/125, 126, 333/127, 128, 136, 134, 129, 132, 204

[56] References Cited

U.S. PATENT DOCUMENTS

| | | | |
|---|---|---|---|
| 4,168,479 | 9/1979 | Rubin | 333/128 X |
| 4,851,797 | 7/1989 | Nakamura | 333/134 |
| 5,150,084 | 9/1992 | Asa et al. | 333/128 |
| 5,281,934 | 1/1994 | Shiau et al. | 333/134 |

*Primary Examiner*—Paul Gensler
*Attorney, Agent, or Firm*—Daryl W. Schnurr

[57] ABSTRACT

A power divider has a microstripline circuit with bandpass filters at each output that are lumped element printed bandpass filters. The filters widen the isolation bandwidth of the divider. Power dividers can be reversed for use as power combiners.

9 Claims, 5 Drawing Sheets

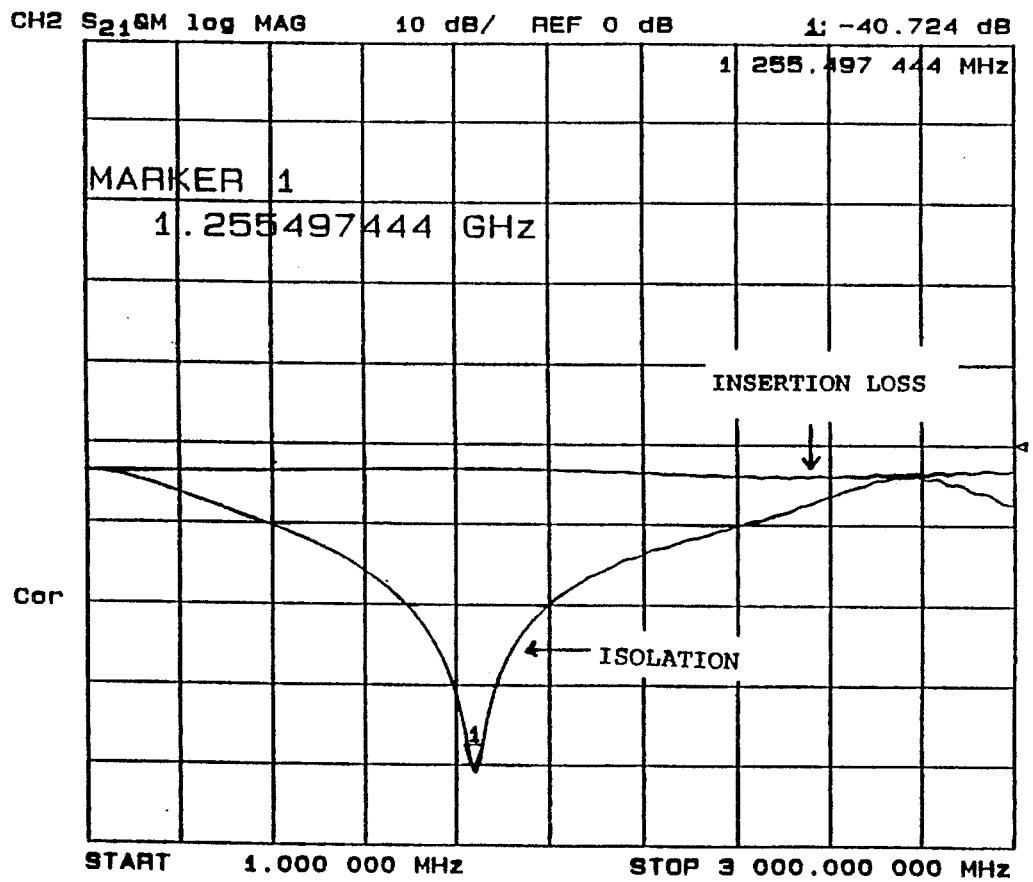
Figure 3  Frequency response (Isolation and Insertion Loss) of a single section power divider

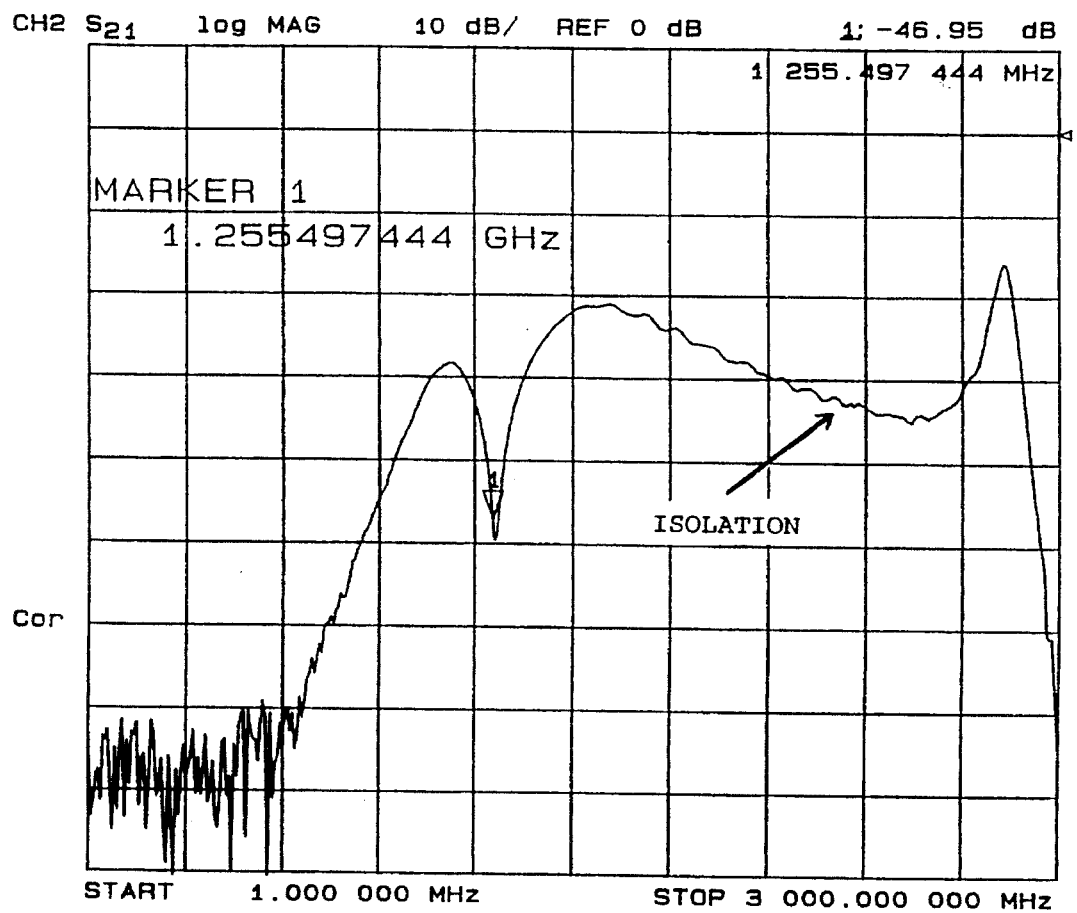
Figure 4  Frequency response (isolation) of the modified power divider

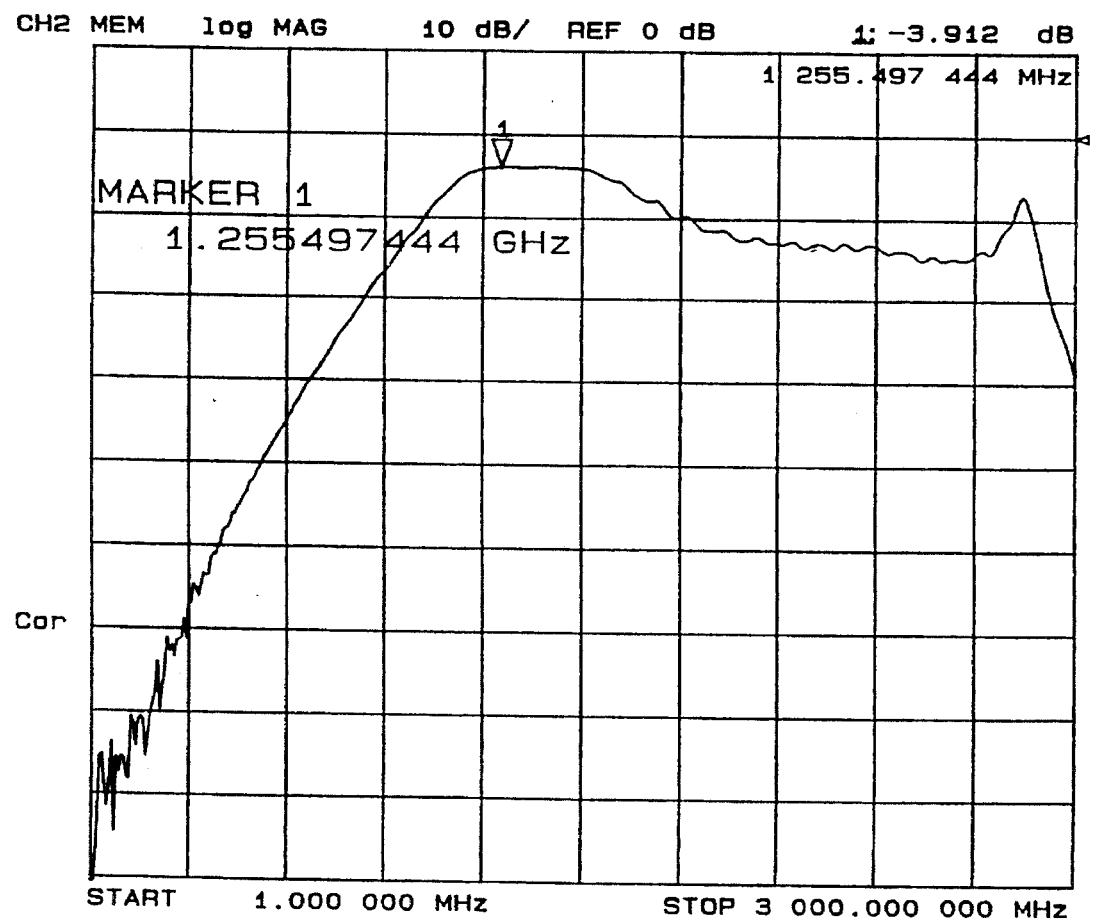
Figure 5. Wide band insertion loss of the modified power divider

POWER DIVIDER/COMBINER WITH LUMPED ELEMENT BANDPASS FILTERS

BACKGROUND OF THE INVENTION

1. Field of the Invention

This invention relates to a power divider/combiner and more particularly to a power divider/combiner that has bandpass filters connected into a circuit thereof.

2. Description of the Prior Art

Power dividers/combiners are known. A power divider, often also referred to as a power splitter, and a combiner have an identical structure. A power divider can be used as a power combiner simply by reversing the input and outputs. For example, when a power divider has one input and two outputs, it can be used as a power combiner having two inputs and one output, the flow of current through the device simply being reversed.

Planar microwave circuits have utilized distributed transmission line structures for the design of active and compassive components (i.e. microstripline and co-planar waveguide structures are the most common). Lumped elements have been used below frequencies of 1,000 MHz.

A paper by Seymour B. Cohn, entitled "A Class of Broad Band Three-Port TEM-Mode Hybrids" was published in IEEE Transactions on Microwave Theory and Techniques, Volume MTT-16, No. 2, in February of 1968. The Cohn paper describes a three-port hybrid that can be used as both a power divider and power combiner. When used as a divider, power entering the input port is said to split equally and with zero phase difference between the output ports. The output ports are said to be highly isolated and the general form of circuit is a T junction followed by a multiplicity of cascaded pairs of TEM line lengths and interconnecting resistors. For bandwidths up to about 1.4:1 the performance is stated to be quite good but at the edges of a 2:1 band, the isolation is only 14.7 dB and the input port VSWR is stated to be 1.42. In a paper by Li, et al. entitled "CAD/CAE Design of an Improved, Wideband Wilkinson Power Divider" in Microwave Journal in November of 1984, it is stated that the Wilkinson power divider does not satisfactorily perform in broad band tests done from 2 to 18 GHz. The suggested improvement is to replace linear sections of the Wilkinson divider with circular sections.

It is known to have interdigital capacitors in lumped element microwave circuits (See "Interdigital Capacitors and Their Application to Lumped-Element Microwave Integrated Circuits", by Gary D Alley IEEE Transactions on Microwave Theory and Techniques, Volume MTT-18, No. 12, Dec. 1970). The difficulty in obtaining acceptable wideband isolation at bandwidths greater than 1.4:1 can be at least partially overcome by increasing the number of sections in the power divider. However, due to size and mass limitations, particularly in satellite applications, this approach is rendered impractical.

SUMMARY OF THE INVENTION

It is an object of the present invention to provide a new form of Wilkinson power divider using distributed and lumped-element design techniques.

A power divider has a circuit having an input and more than one output. The input is connected to a first conducting line extending to a junction. Second conducting lines extend from said junction to each of said outputs, said second conducting lines being spaced apart to minimize coupling between said lines. A bandpass filter is located in each second conducting line at each output to widen an isolation bandwidth of said divider. Each filter is grounded.

BRIEF DESCRIPTION OF THE DRAWINGS

In the drawings:

FIG. 3 is a graph showing a frequency response of a single section two-way prior art power divider;

FIG. 4 is a graph showing a frequency response of a power divider in accordance with the present invention; and FIG. 5 is a graph showing the insertion loss of a power divider through one path with a second output port terminated in a matched load.

DESCRIPTION OF A PREFERRED EMBODIMENT

Figure 1:
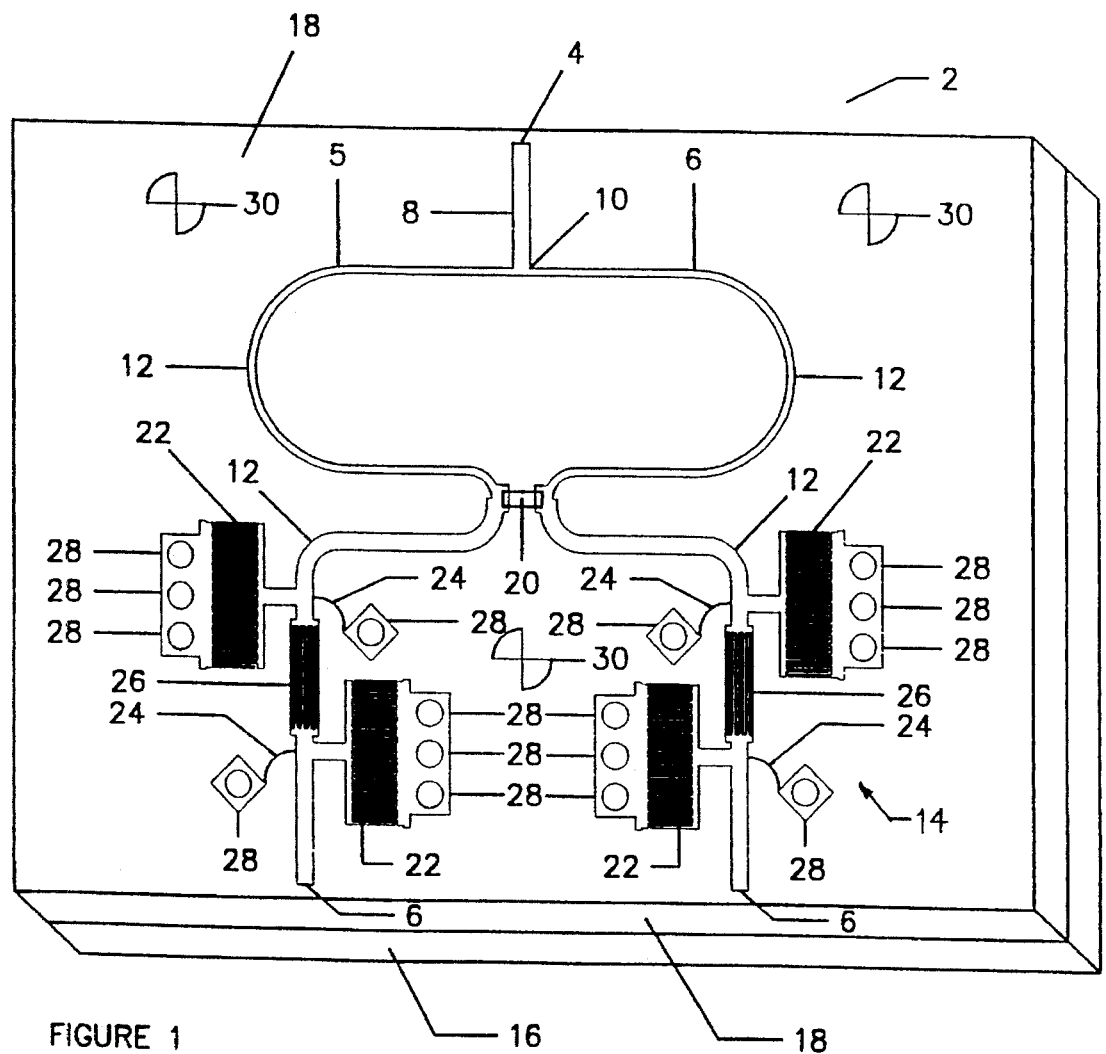
In FIG. 1, there is shown a perspective view of a power divider.
Figure 2:
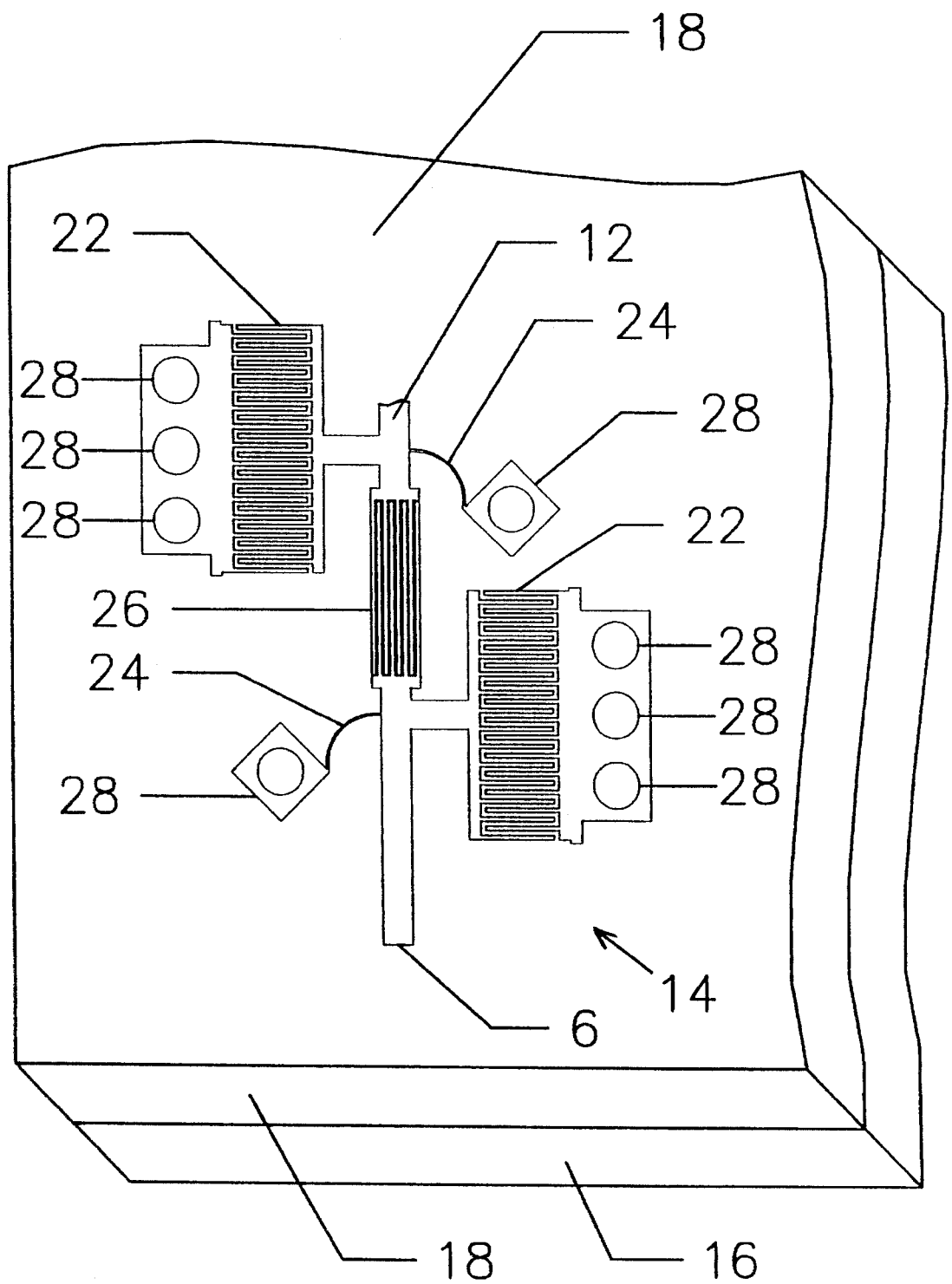
FIG. 2 shows an enlarged perspective view of a printed lumped-element bandpass filter.

In FIG. 1, there is shown a circuit for a power divider 2 having an input 4 and two outputs 6. The input 4 is connected to a first conducting line 8 extending to a junction 10 preferably, the junction 10 is a TEE junction. The second conducting lines 12 extend from the junction 10 to each of the outputs 6. The second conducting lines are spaced apart to minimize coupling between said lines. A bandpass filter 14 is located in each of the second conducting lines at each output to widen an isolation bandwidth of said divider. Each filter is grounded (FIG. 2 is an enlarged version of a filter as shown in FIG. 1).

The circuit of the power divider 2 is fabricated in microstripline on an aluminum backed base 16 of Thermo-set Microwave Material (TMM - 10) substrate material 18. The second conducting lines 12 emerging from the TEE junction 10 are designed to represent $\sqrt{2}\ Z_0 \Omega$ impedance where $Z_0$ is the system impedance. The length of these lines are a quarterwave at a centre frequency of the specified frequency band for the divider. The second conducting lines diverge immediately after the TEE junction and then converge to a resistor 20 that is common to the two second conducting lines 12. Preferably, the resistor 20 is a chip resistor. The junction, which is modelled as a cross-junction, has a single-step impedance transformer to 50 ohms leading to the two outputs 6.

Each bandpass filter consists of capacitively coupled two shunt resonators. Each resonator consists of a shunt interdigital capacitor 22 and a shunt loop inductor 24. A series interdigital capacitor 26 couples the two resonators for each filter.

Grounding is achieved by utilizing blind plated through holes or through holes 28 at a termination point of the shunt capacitors and shunt inductors. Residual inductances due to the through hole are compensated in the design. Mounting holes 30 are provided to fasten the circuit to the substrate material 18. FIG. 1 is a modified form a single section Wilkinson power divider or splitter with the printed lumped-element filters integrated with the output ports in a single layer.

By comparing FIGS. 3 and 4, it can be seen that the isolation bandwidth is significantly improved by the modified structure of the present invention. The physical size of the device that is used to produce the result shown in FIG. 5 is 1.1"×1.1".

The design of the bandpass filter is obtained from standard network theory and is constructed using lumped elements. The lumped inductors and capacitors are transformed into equivalent printed loop inductors and interdigital capacitors. Models for the lumped elements are obtained from literature considering various design rules regarding frequency range, quality factor, miniaturization and other manufacturing aspects. The interdigital capacitor design involves an optimum selection of the number of fingers, finger width and length of the finger (See "Design of Interdigitated Capacitors and Their Application to Gallium Arsenide Monolithic Filters" by Esfandiari, et al., IEEE Transactions on Microwave Theory and Techniques, Volume 31, No. 1, Jan. 1983). These parameters are optimized such that the variation of the capacitance value with frequency is minimized.

The structure of the present invention can be implemented on gallium arsenide substrate for Monolithic Microwave Integrated Circuits and high temperature superconducting material.

What I claim as my invention is:

1. A power divider comprising a circuit having an input and more than one output, said input connected to a first conducting line extending to a junction, with second conducting lines extending from said junction to each of said outputs, said second conducting lines being spaced apart to minimize coupling between said lines, a lumped element printed bandpass filter being located in each second conducting line at each output to widen an isolation bandwidth of said divider, said circuit being a microstripline circuit, each filter being grounded.

2. A power divider as claimed in claim 1 wherein each printed bandpass filter has two capacitively coupled shunt resonators.

3. A power divider as claimed in claim 2 wherein each resonator consists of a shunt interdigital capacitor and a shunt loop inductor.

4. A power divider as claimed in claim 3 wherein the microstripline circuit is constructed of thermal set microwave material.

5. A power divider as claimed in claim 1 wherein the junction is a TEE junction and there are two outputs, said second conducting lines diverging immediately after said TEE junction and then converging to a resistor that is common to the two second conducting lines.

6. A power divider as claimed in claim 5 wherein the filters are grounded by through holes.

7. A power divider as claimed in claim 5 wherein the filters are grounded by blind plated through holes.

8. A power divider as claimed in claim 1 wherein the circuit has an aluminum base.

9. A power divider comprising a circuit having an input and more than one output, said input connected to a first conducting line extending to a TEE junction, with second conducting lines extending from said junction to each of said outputs, said second conducting lines diverging immediately after said TEE junction and then converging to a resistor that is common to the two second conducting lines, a bandpass filter being located in each second conducting line at each output to widen an isolation bandwidth of said divider, each filter being grounded.

* * * * *